United States Patent
Meyer et al.

(10) Patent No.: US 8,238,634 B1
(45) Date of Patent: Aug. 7, 2012

(54) EFFICIENT OFF-RESONANCE CORRECTION METHOD AND SYSTEM FOR SPIRAL IMAGING WITH IMPROVED ACCURACY

(75) Inventors: Craig H. Meyer, Charlottesville, VA (US); Weitian Chen, Union City, CA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1200 days.

(21) Appl. No.: 12/036,693

(22) Filed: Feb. 25, 2008

Related U.S. Application Data

(60) Provisional application No. 60/903,021, filed on Feb. 23, 2007.

(51) Int. Cl.
*G06K 9/00* (2006.01)
(52) U.S. Cl. .................. 382/131; 382/128; 600/410
(58) Field of Classification Search .......... 382/128–132; 600/410
See application file for complete search history.

(56) References Cited

U.S. PATENT DOCUMENTS

| | | | | |
|---|---|---|---|---|
| 5,311,132 | A * | 5/1994 | Noll et al. ..................... | 324/309 |
| 6,396,269 | B1 * | 5/2002 | Hajnal et al. .................. | 324/307 |
| 7,005,854 | B2 * | 2/2006 | Mitchell et al. ............... | 324/309 |
| 7,285,955 | B2 * | 10/2007 | Roberts et al. ................ | 324/309 |
| 7,486,839 | B2 * | 2/2009 | Moriguchi et al. ........... | 382/280 |
| 2004/0243169 | A1 * | 12/2004 | Ricci et al. .................... | 606/192 |
| 2005/0017717 | A1 * | 1/2005 | Duerk et al. ................... | 324/307 |
| 2005/0040821 | A1 * | 2/2005 | Hargreaves et al. .......... | 324/307 |

OTHER PUBLICATIONS

Reducing Spurious minima—Spiral imaging, Lee et al., PISMRM 11,2004, p. 2678.*
Automatic Field—Imaging, Nayak et al., MRIM 43, 2000, pp. 151-154.*
Irarrazabal P, Meyer CH, Nishimura DG, Macovski A. Inhomogeneity correction using an estimated linear field map. Magn Reson Med 1996; 35: 278-82.
Ahunbay E, Pipe JG. Rapid Method for Deblurring Spiral MR Images. Magn. Reson. Med 2000; 44: 491-494.
Noll DC, Meyer CH, Pauly JM, Nishimura DG. A homogeneity correction method for magnetic resonance imaging with time-varying gradients. IEEE Trans. Med. Imaging 1991; 10: 629-637.
Noll DC, Reconstruction techniques for magnetic resonance imaging, PhD. Thesis, Stanford University (1991).
Man LC, Pauly JM, Macovski A. Multifrequency interpolation for fast off-resonance correction. Magn Reson Med 1997; 37: 785-792.
Moriguchi H, Dale BM, Lewin JS, Duerk JL, Block regional off-resonance correction (BRORC): A fast and effective deblurring method for spiral imaging. Magn Reson Med 2003; 50: 643-648.
Man LC, Pauly JM, Macovski A, Correcting severe local inhomogeneity blurs by spatially variant deconvolution, in Proc, SMR 1995; 738.
Harshbarger TB, Twieg DB, Iterative reconstruction of single-shot spiral MRI with off resonance. IEEE Trans. Med. Imaging 18, 196-205 (1999).
Sutton BP, Noll DC, Fessler JA. Fast, iterative image reconstruction for MRI in the presence of field inhomogeneities. IEEE Trans. Med. Imaging 2003; 22(2): 178-188.

(Continued)

*Primary Examiner* — Jayesh A Patel
(74) *Attorney, Agent, or Firm* — Blank Rome LLP

(57) ABSTRACT

Automatic off-resonance correction for spiral MR imaging is performed in two stages. In the first stage, we acquire a low resolution map using two single shot spirals instead of estimating it using an automatic method. In the second stage, we developed a modified version of automatic off-resonance correction with a frequency constraint from the first stage map.

14 Claims, 3 Drawing Sheets

OTHER PUBLICATIONS

Makhijani MK, Nayak KS Exact correction of sharply varying off-resonance effects in spiral MRI using spatially varying deconvolution. In Proc, Intl. Soc. Mag. Reson. Med. 2006; 2372.

Nayak KS, Tsai CM, Meyer CH, Nishimura DG. Efficient Off-resonance Correction for Spiral Imaging. Magn Reson Med 2001; 45:521-524.

Noll DC, Pauly JM, Meyer CH, Nishimura DG, Macovski A. Deblurring for Non-2DFTMRI. Magn Reson Med 1992; 25: 319-333.

Man LC, Pauly JM, Macovski A. Improved automatic off-resonance correction without a field map in spiral imaging Magn Reson Med 1997; 37: 906-913.

Chen W, Meyer CH. Fast automatic linear off-resonance correction method for spiral imaging Magn Reson Med 2006; 56: 457-462.

Lee D, Nayak KS, Pauly JM. Reducing spurious minima in automatic off-resonance correction for spiral imaging, in Proc, Intl. Soc. Mag. Reson. Med. 2004; 2678.

Schomberg H, Off-Resonance Correction of MR Images. IEEE Trans Med Imaging 1999; 18:481-495.

A. Macovski, Volumetric NMR imaging with time-varying gradients. Magn. Reson. Med. 1985; 2: 29-40.

A. Maeda, K. Sano, T. Yokoyama, Reconstruction by weighted correlation for MRI with time-varying gradients. IEEE Trans. Med. Imaging 7, 26-31 (1988).

Hoge RD, Kwan RK, Pike GB, Density compensation functions for spiral MRI. Magn. Reson. Med. 1997; 38: 117-128.

Noll DC, Fessler JA, Sutton BP. Conjugate phase MRI reconstruction with spatially variant sample density correction IEEE Trans. Med. Imaging 2005; 24: 325-336.

Jackson JI, Meyer CH, Nishimura DG, Macovski A. Selection of a convolution function for Fourier inversion using gridding IEEE Trans. Med. Imaging 1991; 10: 473-478.

Luk Pat GT, Kerr AB, Nishimura DG. Inhomogeneity correction for echo-planar imaging with a polynomial estimate of the field map, in Proc SMR, 3rd Annual Meeting, Nice, Aug. 1995.617.

Chen W, Meyer CH. Fast conjugate phase reconstruction using Taylor approximation, in Proc, Intl. Soc. Mag. Reson. Med. 2007, accepted.

Meyer CH, Pauly JM, Macovski A, Nishimura DG. Simultaneous spatial and spectral selective excitation. Magn Reson Med 1998; 15: 287-304.

Wang WT, Meyer CH. Estimating in vivo spatial resolution of magnetic resonance images using radiofrequency tagging pulses, in Proc, Intl. Soc. Mag. Reson. Med. 2006; 2629.

Chen W, Mugler JP, Altes TA, Brookeman JR, Cates GD, de Lange EE, and Meyer CH, An auto-focusing off-resonance correction method and its application to dynamic 3He imaging of the lung, In Proceedings of the ISMRM 13th Annual Meeting, Miami, 2005, 2300.

King KF, Ganin A, Zhou XJ, Bernstein MA. Concomitant gradient field effects in spiral scans. Magn Reson Med 1999; 41:103-112.

* cited by examiner

EFFICIENT OFF-RESONANCE CORRECTION METHOD AND SYSTEM FOR SPIRAL IMAGING WITH IMPROVED ACCURACY

REFERENCE TO RELATED APPLICATION

The present application claims the benefit of U.S. Provisional Patent Application No. 60/903,021, filed Feb. 23, 2007, whose disclosure is hereby incorporated by reference in its entirety into the present disclosure.

STATEMENT OF GOVERNMENT INTEREST

The work leading to the present invention was supported by NIH Grant No. HL079110. The government has certain rights in the invention.

FIELD OF THE INVENTION

The present invention is directed to imaging using a spiral scan and more particularly to such imaging that provides rapid and accurate off-resonance correction.

DESCRIPTION OF RELATED ART

Spiral scanning is extensively used in magnetic resonance (MR) imaging and has a number of desirable properties, such as short scan time, resistance to motion artifacts, capability to achieve short echo time, and excellent gradient efficiency. One major limitation, however, is image blurring due to off-resonance effects from main field inhomogeneity and tissue-induced susceptibility variations. This problem is more pronounced with long readout times and at high field strength.

Many image deblurring methods have been developed to correct for off-resonance effects in spiral imaging.

The linear off-resonance correction method is a widely used method that requires little computation and is robust at low signal-noise ratio (SNR) regions. However, this technique assumes a linear field map and therefore residual blurring can manifest at the locations where the field value deviates from the linear variation. Image domain deconvolution approximates the off-resonance phase as a separable quadratic function, which allows image deblurring to be carried out as rapid one-dimensional deconvolutions. A drawback of this method is that it can become ineffective when the deviation of the off-resonance phase from the quadratic function cannot be ignored. Conjugate phase reconstruction is an effective but computationally expensive off-resonance correction method. Fast alternatives, including time-segmented reconstruction, frequency-segmented reconstruction, and multifrequency interpolation, and variants have been developed. A fundamental assumption for conjugate phase reconstruction and its alternatives is that the magnetic field varies slowly in space. Alternative image reconstruction methods have been developed for off-resonance correction when this assumption is violated.

All of the previously described pixelwise off-resonance correction methods require a reliable knowledge of the field map that indicates the resonant frequency of spins in each image voxel. Typically a field map is derived from two images acquired by the same spiral scan at different echo times. Field maps acquired by this method can be inaccurate, since the field map itself is susceptible to the off-resonance effect. Another problem associated with this field map acquisition method is that often only a low resolution field map can be acquired in the scan time available. Partial volume effects may cause a low resolution field map to be not accurate enough for a pixelwise off-resonance correction in certain cases. For field map based off-resonance correction methods, the image blurring can remain or even be exaggerated at regions where the estimated off-resonance frequency value deviates from the actual off-resonance frequency.

Automatic off-resonance correction methods are alternative image deblurring methods for non-Cartesian imaging. These methods can estimate a field map from the imaging data set itself and therefore perform off-resonance correction without acquiring a field map. Based on the principle that image is real when reconstructed on resonance, Noll et al (Noll D C, Pauly J M, Meyer C H, Nishimura D G, Macovski A. Deblurring for Non-2DFT MRI. Magn Reson Med 1992; 25: 319-333; see also U.S. Pat. No. 5,311,132) first proposed an automatic correction method that determines a field map by minimizing an objective function that corresponds to the imaginary components of the image. Noll's method is prone to estimation errors when the target field map resolution is high, causing image artifacts in certain cases. To address this problem, Man et al (Man L C, Pauly J M, Macovski A. Improved automatic off-resonance correction without a field map in spiral imaging Magn Reson Med 1997; 37: 906-913) proposed to perform Noll's automatic correction method in two stages: first to estimate a low resolution field map and then to estimate a high resolution field map based on the searching frequency constraint from the low resolution field map. A modified version of this two-stage method is to first estimate a linear map using a fast automatic method and then employ it as a frequency constraint for a second stage automatic off-resonance correction. A common problem for all of these automatic methods, however, is that they are computationally inefficient, which can become impractical when processing a large volume data set.

SUMMARY OF THE INVENTION

It is therefore an object of the invention to provide a computationally efficient method.

To achieve the above and other objects, the present invention is directed to a new off-resonance correction algorithm and related method and system for spiral imaging. The present invention is similar to the previously reported two-stage automatic off-resonance correction method, but has some major differences. In the first stage, we acquire a low resolution map using two single shot spirals instead of estimating it using an automatic method. This modification saves computation, and avoids potential estimation errors that can occur when using an automatic method with inappropriate parameters. In the second stage, we developed a modified version of automatic off-resonance correction with a frequency constraint from the first stage map. The second stage automatic deblurring is more computationally efficient than previous automatic methods and is insensitive to the variation of parameters required in an automatic method. Phantom and volunteer experiments show that the proposed method can provide improved off-resonance correction for spiral imaging compared to the existing map based off-resonance correction methods.

The present invention provides improved off-resonance correction in spiral imaging. In our method, a low resolution field map is acquired by two single shot spirals and a computationally efficient automatic method is performed for off-resonance correction with a frequency constraint from the acquired low resolution field map. Two different strategies to implement this frequency constraint, a linear map constraint and a polynomial map constraint, were investigated. Compared to the previously reported map based off-resonance correction methods, our experiments indicate that the proposed method can provide off-resonance correction with improved accuracy in spiral imaging.

The present invention provides an efficient off-resonance correction method and related system for spiral imaging with improved accuracy. We use two single shot spirals to collect a low resolution field map and then perform a computationally efficient automatic method for off-resonance correction with a frequency constraint from the acquired low resolution field map. The present invention can be used for online reconstruction and can provide more accurate off-resonance correction in spiral imaging than field map based off-resonance correction methods.

BRIEF DESCRIPTION OF THE DRAWINGS

A preferred embodiment of the invention will be disclosed with reference to the drawings, in which.

DETAILED DESCRIPTION OF THE PREFERRED EMBODIMENT

Figures 1A, 1B, 1C:
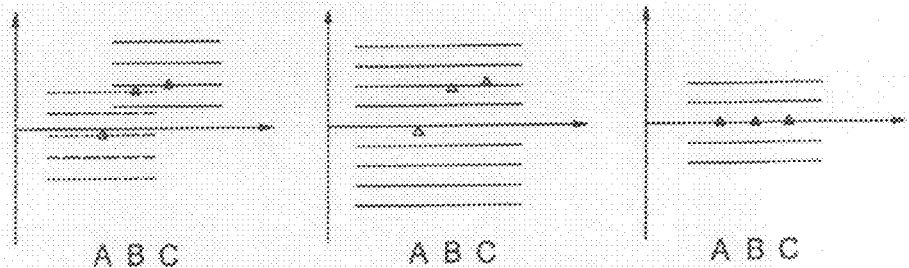
FIGS. 1A-1C show different computational strategies employed to perform automatic off-resonance correction with the searching frequency constrained by a first stage field map.

A preferred embodiment of the present invention will be set forth in detail with reference to the drawings, in which like reference numerals refer to like elements or steps throughout.

The MR signal, ignoring relaxation, from an object with spin density m(r) is given by $$s(t)=\int m(r)\exp\{-i[2\pi k(t)\cdot r+\Delta\omega(r)t]\}dr \quad [1]$$

where r is the spatial position, k(t) is the k-space trajectory, and $\Delta\omega(r)$ is the spatial distribution of the off-resonance.

In the common situation where the spatial variation of the off-resonance frequency is relatively slow, conjugate phase reconstruction is an effective way to remove the image blurring induced by the off-resonance effects in non-Cartesian imaging. Conjugate phase reconstruction can be expressed as following:

$$m(r)=\int s(t)W(t)\exp\{i[2\pi k(t)\cdot r+\Delta\omega(r)]\}dt, \quad [2]$$

where W(t) is the density compensation accounting for the non-uniform sampling in the k-space for non-Cartesian data acquisition. Note that a priori knowledge of the off-resonance map $\Delta\omega(r)$ is necessary in conjugate phase reconstruction in order to achieve accurate off-resonance correction. Conjugate phase reconstruction is computationally expensive. Fast alternatives, including time-segmented reconstruction, frequency-segmented reconstruction, and multifrequency interpolation, can achieve comparable accuracy of image reconstruction but with significantly reduced computational cost.

Automatic off-resonance correction methods can be performed without a priori knowledge of the off-resonance map.

In the original automatic off-resonance correction method proposed by Noll et al, the time signal is demodulated by a set of equally spaced constant frequencies, $\{\Delta\omega_i, i=1, 2 \ldots\}$, and complex images are reconstructed from these demodulated signals, which can be expressed as follows:

$$m(r;\Delta\omega_i)=\int s(t)\exp(i\Delta\omega_i t)W(t)\exp[i2\pi k(t)\cdot r]dt, \quad [3]$$

where m(r; $\Delta\omega_i$) represents the complex image reconstructed at frequency $\Delta\omega_i$. Eq. [3] can be performed by a fast image reconstruction method, such as gridding. After calculating the complex images, an objective function is then calculated pixel by pixel for automatic evaluation of the field map. The objective function is typically chosen as the sum of the absolute value of the imaginary image raised to a certain power within a summation window around the point of interest. The local off-resonance frequency is chosen as the constant frequency which minimizes the objective function calculated at that location. The final deblurred image can be either formed by piecing up the pixels from the complex images or reconstructed using a fast conjugate phase reconstruction method with a smoothed version of the estimated field map.

The automatic method can be better understood by the concept of the point spread function (PSF). As shown in the appendix, the complex image m(r;$\Delta\omega_i$) can also be equivalently expressed by the following formula:

$$m(r; \Delta\omega_i)=\int m_{true}(r')psf(r|r'; \Delta\omega_i)dr' \quad [4]$$

where $m_{true}$(r') is the real-valued physical image, and psf (r|r';$\Delta\omega_i$) is the PSF evaluated at location r given that the input impulse is at location r' and the demodulation frequency is $\Delta\omega_i$. Eq. [4] indicates that the complex images m(r;$\Delta\omega_i$) can be represented as the sum of product of the physical image and the PSFs with the location of input impulse varying throughout FOV. From the mathematical expression of psf (r|r';$\Delta\omega_i$), we can tell that when the demodulation frequency $\Delta\omega_i$ is tuned to the exact off-resonance frequency value at the point of interest, the PSF with the input impulse located at the same location will become a real-valued impulse located at that point. The PSFs with input impulse located at nearby locations can be approximated as real impulses when the spatial variation of the field is slow. The PSFs with input impulse located far away from the point of interest may have a significant imaginary component; however, they will decay away at the location of the point of interest when the field varies smoothly. Consequently, the image value at the point of interest calculated from Eq. [4] approximately equals the value of the real-valued physical image at that point. Conversely, if the demodulation frequency $\Delta\omega_i$ is tuned away from the exact off-resonance frequency at the point of interest, the PSFs at the point of interest and also at the neighboring locations will spread out and have both real and imaginary energy, which results in the image value at the point of interest calculated from Eq. [4] becoming complex. Consequently, the criterion that the complex image m(r;$\Delta\omega_i$) should have minimal imaginary energy can be employed to determine whether or not the demodulation frequency Act), is close to the actual off-resonance frequency.

The imaginary energy of the PSFs can decrease if the demodulation frequency is tuned far away from the actual off-resonance frequency, which can induce spurious minima in the objective function in automatic methods. Increasing the size of the summation window used for objective function calculation may reduce the possibility of encountering spurious minima; however, an increased size of the summation window may also decrease the accuracy of the estimated field map. To address this problem, Man et al proposed performing automatic off-resonance correction in two stages. The first stage is to use a large summation window to estimate a low resolution field map using an automatic method. The second stage is to use a small summation window to estimate a high resolution field map with the searching frequency constrained by the low resolution field map. Since spurious minima usually occur when the demodulation frequency is tuned far away from the exact off-resonance frequency, by constraining the searching range around the low resolution field map, the possibility of encountering spurious minima of the objective function is reduced. The present inventors (Chen W, Meyer C R Fast automatic linear off-resonance correction method for spiral imaging Magn Reson Med 2006; 56: 457-462) previously proposed a modified version of this two-stage automatic off-resonance correction method where a linear map is estimated using fast automatic method and then is used as frequency constraint for the second stage automatic deblurring. One major limitation of all of these automatic methods; however, is computational inefficiency, which makes them impractical in processing large datasets, such as 3D volume and multi-coil data sets.

The algorithm according to the preferred embodiment is compared to previously described two-stage automatic off-resonance correction methods but has some important differences. In the previously described two-stage automatic off-resonance methods, a low resolution field map or a linear map is estimated by the automatic method itself. A problem associated with these methods is that an inappropriate choice of a parameter value required in automatic method, such as the amount of incidental phase to be removed, can lead to estimation error in the first stage map. A low resolution field map can also be acquired efficiently by collecting two single shot spirals with different echo times during the approach to steady state. In the present algorithm, we employ this method to acquire a low resolution field map. This strategy saves computation time and the accuracy of acquired low resolution map is sufficient to provide a frequency constraint for the second stage automatic deblurring.

In the second stage, we perform pixelwise automatic off-resonance correction with searching frequencies constrained by the first stage map. The constraint from the first stage map allows us to use a small summation window in the second stage automatic deblurring to achieve high resolution off-resonance correction. Unlike previous two-stage automatic off-resonance correction methods, linear off-resonance correction is incorporated into image reconstruction in the present algorithm, which can be expressed as following:

$$m(r;\Delta\omega'_i)=\int s'(t)\exp(i\Delta\omega'_i t)W'(t)\exp(i2\pi(k'_x(t)x+k'_y(t)y)dt \quad [5]$$

with $$s'(t)=s(t)\cdot\exp(i2\pi f_0 t)$$

$$k'_x(t)=k_x(t)+\alpha t,$$

$$k'_y(t)=k_y(t)+\beta t$$

where $f_0$, $\alpha$ and $\beta$ are the center frequency, x and y gradient of the extra acquired low resolution map, respectively, $W'(t)$ is the density compensation function after considering the gradient of field inhomogeneity, and $\Delta\omega'_i$ (i=1, 2 ...) are a series of constant frequencies used to search for the non-linear components of the off-resonance frequency. Note that $\Delta\omega'_i$ (i=1, 2 ...) in Eq. [5] defines a searching range of only the non-linear components of the off-resonance frequencies. Conversely, the previous automatic methods search for the actual off-resonance frequency directly. This modification can significantly improve the computational efficiency of our algorithm, which will be discussed in more detail below.

After calculating images in Eq. [5], the objective function is then calculated as:

$$\epsilon(r;\Delta\omega'_1)=\int_{H(r)}|Im\{m(r;\Delta\omega'_i)\}|^\alpha dr, \quad [6]$$

where H(r) and $\alpha$ represent the summation window and a constant power, respectively. A small summation window can be used here to achieve high resolution off-resonance correction because the possibility of encountering a spurious minimum of objective function is reduced with the frequency constraint from the acquired linear map. The map of the non-linear component of off-resonance frequency is determined as:

$$\Delta\omega'_{L(r)}(r), \text{ such that } L(r)=\arg\min_i\epsilon(r;\Delta\omega'_i). \quad [7]$$

After acquiring $\Delta\omega'_{L(r)}(r)$, we smooth it using a small window and the final image is reconstructed using Eq. [5] after replacing $\Delta\omega'_i$ with smoothed $\Delta\omega'_{L(r)}(r)$.

When the field inhomogeneity has a significant linear gradient, the PSFs in Eq. [4] can be skewed, which may reduce the effectiveness of automatic methods. One advantage of the present method is that this effect is inherently corrected in Eq. [5]. The proposed method also allows us to use a recursive method to calculate the objective function, which is impossible to implement in the previous two-stage automatic methods.

In certain cases, when the field inhomogeneity is highly non-linear, we can estimate a higher order polynomial map from the acquired low resolution field map and use it to constrain the second stage automatic off-resonance correction. A smooth polynomial approximation to the low resolution field map can be estimated rapidly by minimizing the following weighted least square norm:

$$\||m(r)|(\Delta\omega_p(r)-\Delta\omega(r))\|_2, \quad [8]$$

where $|m(r)|$ represents the magnitude of the low resolution image which is reconstructed from the map data sets; $\Delta\omega_p(r)$ and $\Delta\omega(r)$ represent the polynomial approximation and the low resolution map, respectively.

When using a polynomial map as a frequency constraint for the second stage automatic deblurring, the image reconstruction can be expressed as follows:

$$m(r;\Delta\omega''_i)=\int s(t)\exp\{j[(\Delta\omega''_i+\Delta\omega_p(r)]t\}W(t)\exp[i2\pi k(t)\cdot r]dt, \quad [9]$$

where k(t) and W(t) are same as those defined in Eq. [2], and $\{\Delta\omega''_i, i=1, 2 ...\}$ is a series of constant frequencies used to search for the deviation of the actual off-resonance frequency from the acquired polynomial map. Note that similar to Eq [5], in Eq. [9] we search for the deviation of the actual off-resonance frequency from the first stage map instead of the actual off-resonance frequency itself. For Eq. [9], calculating images at $\{\Delta\omega''_i, i=1, 2 ...\}$ can be achieved by using multifrequency interpolation or the Taylor approximation method given a spatially varying polynomial map $\Delta\omega_p(r)$. After calculating the images in Eq. [9], the objective function can be calculated as described by Eq. [6] and the deviation of the actual off-resonance frequency from the first stage polynomial map can be determined as described in Eq. [7]. For polynomial map constrained automatic off-resonance correction, the objective function calculation can also be performed using the recursive method described in the inventors' previous paper cited above to improve the computational efficiency.

Multifrequency interpolation requires reconstructing a series of base images at different demodulation frequencies. To reduce the computational cost, we can interchange the order of demodulation and gridding for base image reconstruction. A strategy we employed is to use Delaunay triangulation to generate a sampling time mask on Cartesian grids and then to perform demodulation directly on the k-space data after gridding. When generating the time mask, the sampling time on the corners of Cartesian grids is set as total readout time. When implementing this strategy in multifrequency interpolation, gridding still needs to be performed for data in a small region close to the origin in k-space. To reduce the computation time in off-resonance correction based on a polynomial map constraint, the time mask can be calculated offline and loaded during online reconstruction for a given k-space trajectory. For off-resonance correction based on a linear map constraint, the time mask needs to be calculated online since the k-space trajectory is warped by the linear gradient. However, in our experiments, we usually found that the time mask generated offline can still be used for off-resonance correction based on a linear map constraint.

As discussed in previous works, the incidental phase caused by sources other than off-resonance effects must be removed when performing automatic off-resonance correction. We use the method described in our previous paper cited above to remove the incidental phase. In our experiments, we found a benign property of the present off-resonance correction method is that the second stage automatic deblurring is insensitive to variations of parameters used to determine the amount of incidental phase to be removed. A practical note is that when incorporating linear off-resonance correction in automatic deblurring, as described in Eq. [5], the incidental phase should be estimated from the demodulated signal s'(t) rather than the raw signal s(t).

Compared to the previous automatic methods, we have developed the following strategies to reduce the computational cost of the proposed algorithm. First, since the first stage field map is acquired from extra data instead of by automatic methods, there is little computational cost for first stage field map estimation. Second, in the present method, we use the automatic method to search for the deviation of the actual off-resonance frequency map from the first stage map. Conversely, in previous methods, the automatic method was used to search for the actual off-resonance frequency directly. FIGS. 1A-1C demonstrate the computational advantage of the present strategy. FIG. 1A illustrates the computational strategy employed in previous two-stage automatic methods. Under this computational strategy, different points have a different set of searching frequencies given a spatially varying first stage map. Point A, B, and C in FIGS. 1A-1C represent three arbitrary points within the FOV. The dashed lines and solid lines in FIG. 1A represent the searching frequencies at point A and C, respectively. When a neighboring point B is included in their respective summation windows, the image value at point B must be calculated at different constant frequencies accordingly. This results in the redundant calculation of image values at many frequencies. FIG. 1B shows an alternative computational strategy for two-stage automatic off-resonance correction that was employed in Lee D, Nayak K S, Pauly J M. Reducing spurious minima in automatic off-resonance correction for spiral imaging, in Proc., Intl. Soc. Mag. Reson. Med. 2004; 2678, where a series of images are calculated at constant frequencies within the searching range of off-resonance frequencies. The computational cost of this strategy is proportional to the frequency variation of the first stage map. FIG. 1C illustrates the computational strategy according to the preferred embodiment. Under this strategy, the automatic method is used to search for the deviation of the actual off-resonance frequency map from the first stage map, and only a few images need to be calculated throughout the FOV due to the small searching range. In the extreme case when the first stage map is a constant, the computational strategies described in FIGS. 1A-1C will have the same computational cost. The third strategy we used to improve the computational efficiency is to employ a recursive method to calculate the objective function, which is impossible to implement with the computational strategy of FIG. 1A or 1B given a spatially-varying first stage map. The idea of calculating the objective function recursively is simple, but it is more efficient than calculating the objective function directly.

Figure 5:
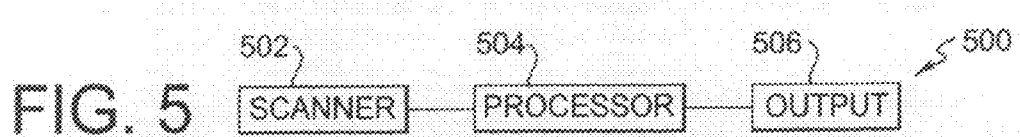
FIG. 5 is a schematic diagram showing a system on which the preferred embodiment can be implemented.

Various hardware can be used. For example, as shown in FIG. 5, the hardware 500 can include a scanner 502, a processor 504, and a display or other output 506. In addition to, or instead of, the scanner, the processor can include an input for previously collected raw data. We have developed software for the proposed off-resonance correction algorithm under the Siemens Image Calculation Environment (ICE) system (Siemens Medical Solutions) for online reconstruction of spiral scans in our Siemens 1.5T Avanto scanner. We have also applied our algorithm to data sets acquired from a Siemens 1.5T Sonata scanner. For our spiral scans, typical parameters are as follows: 14 spiral interleaves for imaging data acquisition; 2 single shot spirals with echo delay 1 ms for map data acquisition; 8192 samples per interleave with 2 microseconds ADC dwell time, which amounts to a 16.4 ms readout; and 512×512 reconstructed image matrix size. Fat was suppressed either by fat saturation or a spectral-spatial pulse during data acquisition.

When implementing the proposed off-resonance correction method, we typically use the following parameters: the size of summation window was 12×12; the power a of the objective function was 1; the first 1.2 ms of the readout was used to estimate the incidental phase (14); the searching range of the deviation of the actual map from the first stage map was from −50 Hz to 50 Hz; and the increment of searching frequencies was 10 Hz.

We have performed field map based linear off-resonance correction, multifrequency interpolation, and the proposed method on the same data sets, and compared the results with each other. For some data sets, a high resolution field map was acquired by repeating two multi-shot spiral scans with echo delay 1 ms, which was then used to support map-based multifrequency interpolation off-resonance correction.

The images were overall less blurry after applying linear off-resonance correction. However, residual image blurring remained in many data sets. In some data sets, image blurring was exaggerated in local regions after applying linear off-resonance correction indicating strong non-linearity of the field inhomogeneity in theses regions. Multifrequency interpolation based on an extra acquired field map can provide high quality off-resonance correction for some of the data sets. However, for other data sets, residual image blurring remained after off-resonance correction using mutlifrequency interpolation based on either low resolution or high resolution field map, indicating the inaccuracy of the acquired field maps in local regions. The proposed off-resonance correction method was the most robust among these methods in providing high quality off-resonance correction. The linear map constrained automatic method was employed in most of our in vivo applications. The polynomial map constrained automatic method was found to provide more accurate off-resonance correction than the linear map constrained automatic method in certain applications, particularly phantom studies, due to strong non-linear field inhomogeneity.

Figure 2A:
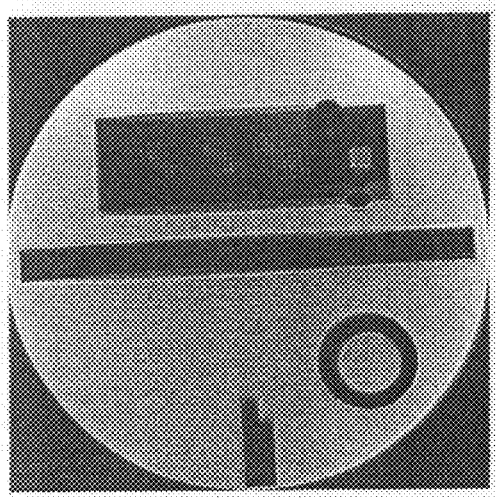
FIGS. 2A-2D show phantom images acquired using a spiral scan and reconstructed with different off-resonance correction methods.
Figure 2B:
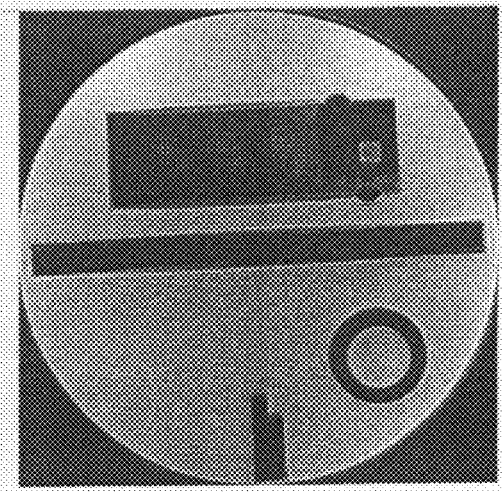
Figure 2C:
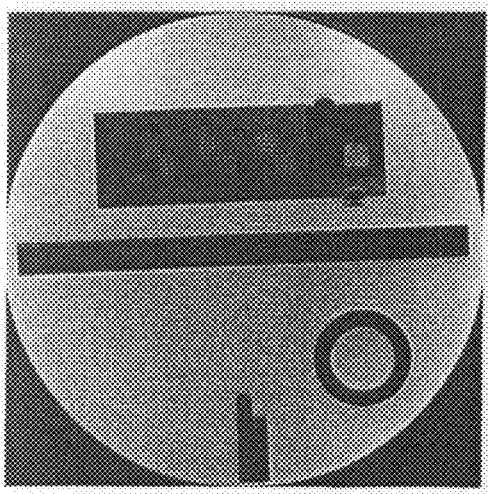
Figure 2D:
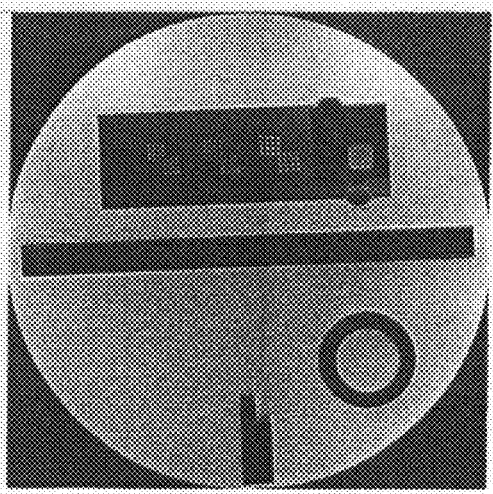

FIGS. 2A-2D show the results of a spiral gradient-echo scan of a phantom acquired on a Siemens Avanto 1.5T scanner. The field of view was 28 cm², slice thickness was 5 mm, and TE was 5 ms. FIG. 2A is the image without off-resonance correction. FIG. 2B is the image after linear off-resonance correction. Note that the linear off-resonance correction provided little image deblurring for this phantom data set due to the strong non-linear inhomogeneity. FIG. 2C is the image after off-resonance correction using multifrequency interpolation, which was performed using an acquired high resolution field map. Note that image blurring remains in some regions. FIG. 2D is the image after off-resonance correction using the proposed method with a polynomial map as the first stage map. Note that most of the image blurring artifacts are removed in FIG. 2D.

Figure 3A:
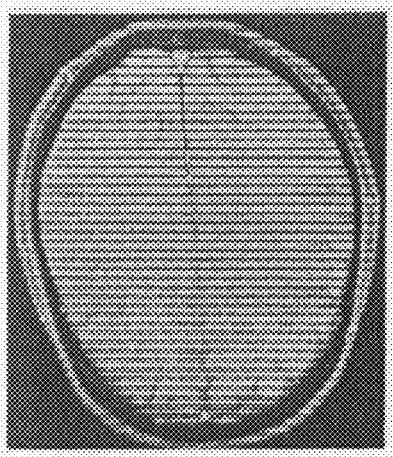
FIGS. 3A-3H show head images of a normal volunteer acquired using a spiral scan, in which tagging lines were created to make the off-resonance effect more prominent.
Figure 3B:
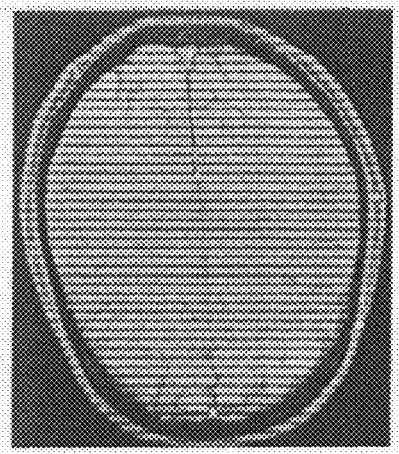
Figure 3C:
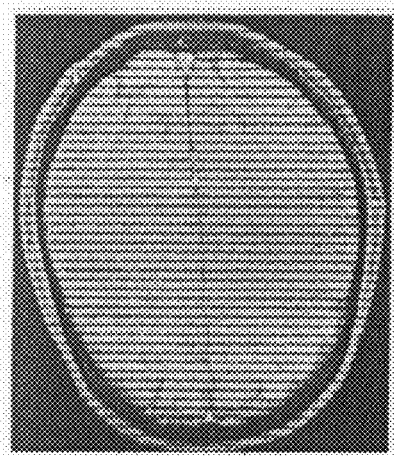
Figure 3D:
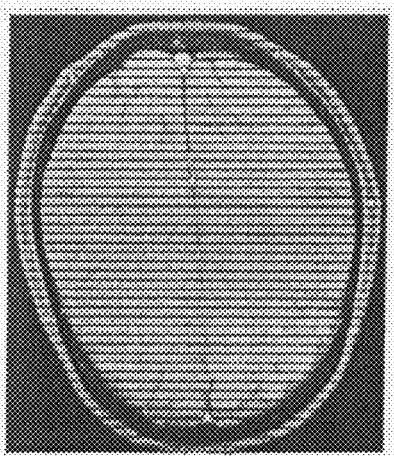
Figure 3E:
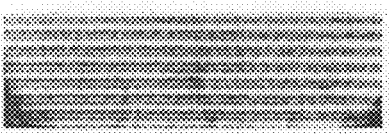
Figure 3F:
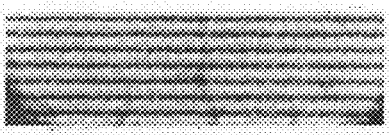
Figure 3G:
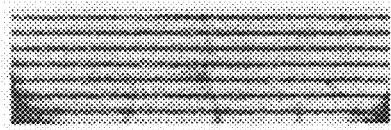
Figure 3H:
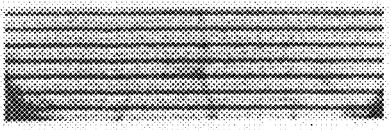

FIGS. 3A-3H show the results of a spiral gradient echo head scan of a normal volunteer on a Siemens Avanto 1.5T scanner. A head coil with 4 channels was used to collect the data. Tagging RF pulses were applied to create tag lines on the image to make off-resonance effects more prominent. The field of view was 28 cm², slice thickness was 5 mm, and TE was 5 ms. FIGS. 3A and 3E are images without off-resonance correction. FIGS. 3B and 3F are images after linear off-resonance correction. Note that image blurring is reduced in most regions but slightly increased in the lower part of the image after linear off-resonance correction. FIGS. 3C and 3G are images after off-resonance correction using multifrequency interpolation. Multifrequency interpolation was performed based on an acquired high resolution field map. Note that image blurring remains in some regions. FIGS. 3D and 3H are images after off-resonance correction using the proposed method with a linear map as the first stage map. Note that most image blurring artifacts are removed after applying the proposed off-resonance correction method.

Figures 4A, 4B:
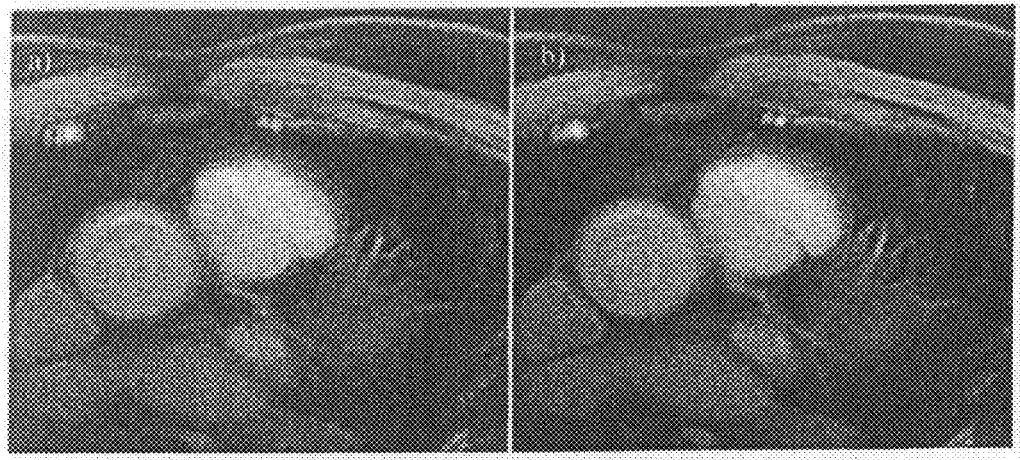
FIGS. 4A-4D show coronary images of a normal volunteer acquired using a spiral spin-echo sequence. a) is an image without off-resonance correction.
Figures 4C, 4D:
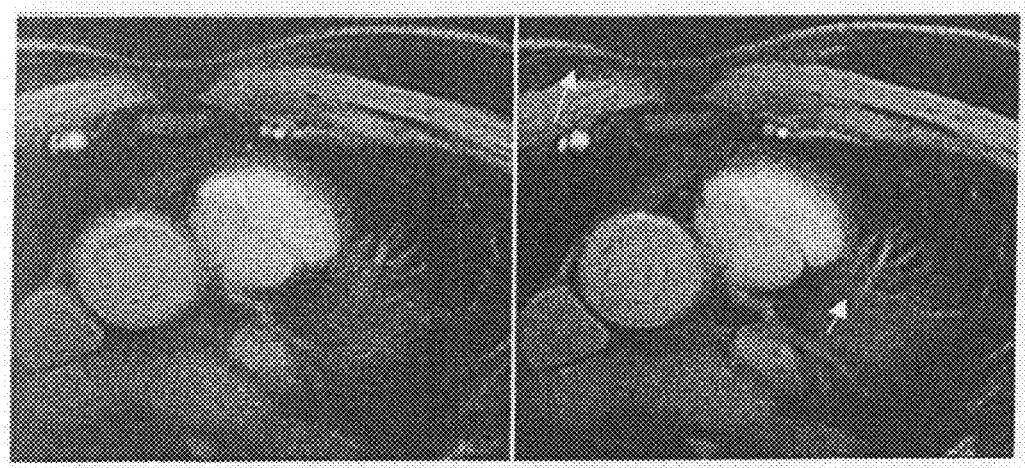

FIGS. 4A-4D show the results on a gated, breath-held, spiral spin-echo scan of the left coronary arteries of a normal volunteer acquired on a Siemens Sonata 1.5T scanner. For this data set, the field of view was 28 cm², the slice thickness was 7 mm, and the TE was 10 ms. FIGS. 4A, 4B, and 4C are images without off-resonance correction, with linear off-resonance correction, and with off-resonance correction using multifrequency interpolation, respectively. Only a low resolution field map was acquired for this data set for multifrequency interpolation due to limited scan time. Note that image blurring remains after off-resonance correction using both linear correction and multifrequency interpolation. FIG. 4D is the image after off-resonance correction using the proposed method with a linear map as the first stage map. Most image blurring artifacts are removed after applying the proposed method.

The present off-resonance correction method is computationally efficient. The image reconstruction system of our 1.5T Avanto scanner uses an AMD Opetron™. Our online reconstruction program takes about 1 to 2 seconds and 2 to 3 seconds when using linear and polynomial map constraint, respectively, to process a single coil data set with the parameters specified in the method section.

When implementing automatic off-resonance correction, we need to specify the value of parameters including the size of the summation window, the power of the objective function, and the amount of the incidental phase to be removed. Incorrect choices of the value of these parameters may lead to image artifacts. The original automatic off-resonance correction method proposed by Noll et al is sensitive to variations of these parameters. A moderate change of the value of these parameters may induce spurious minima. A desirable property of our proposed algorithm is that it is insensitive to variation in these parameters. The value of these parameters was kept constant when applying our algorithm for our regular spiral scans. When reducing the number of spiral interleaves to less than five, we found we needed to increase the size of the summation window when implementing our method.

We have also implemented our method for regional deblurring when only certain sections of images are of clinical interest. Performing regional deblurring can further reduce the computational cost. The linear map constraint can have improved accuracy when applying our algorithm for regional deblurring since the linear approximation only applies to a local region.

As previously indicated by Man et al, off-resonance correction can reduce image blurring artifacts and increase spatial resolution in spiral imaging without losing SNR. We did not observe visible SNR change when applying our proposed algorithm for off-resonance correction.

In the present algorithm, we used two additional single shot spirals to acquire a low resolution field map. These single shot spirals are also used to set up the approach to steady state. A low resolution field map acquisition can be incorporated into imaging data acquisition by using a variable density spiral scan. Further study should be investigated whether the proposed method can be incorporated into this variable density spiral imaging method. We recently reported a rapid automatic method to estimate a linear map in our previous paper cited above. This method can be combined with the proposed method to perform rapid pixelwise automatic off-resonance correction without acquiring a low resolution field map.

Our experimental data sets were all acquired from 1.5T scanners. Image blurring for spiral imaging at 3T can be more severe since the off-resonance effects are usually stronger at 3T. One likely challenge in applying our algorithm at 3T is that the acquired low resolution field map may become less accurate, since the single shot spirals are susceptible to off-resonance effects. If this occurs, we may apply a rapid automatic center frequency correction on the two single shot spirals before calculating the low resolution map.

One limitation of the present method is that it assumes the field is slowly varying in space. Though this assumption is valid in common applications, it can be violated in certain regions in the body, such as near the sinus. The present algorithm is inapplicable at those regions.

Automatic off-resonance correction methods use the minimum of the imaginary component of the image as a focusing criterion. Flow can also induce phase in MR images. As discussed by Man et al, this is not a problem when applying automatic off-resonance correction for spiral imaging since it is resistant to motion artifacts. For spiral imaging off isocenter, concomitant gradients may also induce image phase and can cause image blurring artifacts.

While a preferred embodiment has been set forth in detail above, those skilled in the art who have reviewed the present disclosure will readily appreciate that other embodiments can be realized within the scope of the present invention. For example, numerical limitations are illustrative rather than limiting, as are disclosures of specific technologies and sources. Therefore, the present invention should be construed as limited only by the appended claims.

APPENDIX

Automatic off-resonance correction involves image reconstruction at a set of constant frequencies $\{\Delta\omega_i\}$. The signal is first demodulated by the constant frequencies $\Delta\omega_i$, and then followed by a rapid image reconstruction method, such as gridding, to form an image. Here we derive how the reconstructed image is related to the PSF function.

The image reconstructed at demodulation frequency $\Delta\omega_i$ can be expressed as follows:

$$m(r,\Delta\omega_i)=\int s(t)\exp(i\Delta\omega_i t)W(t)\exp[i2\pi k(t)\cdot r]dt \quad [A.1]$$

Substituting Eq. [1] into Eq. [A.1] and rearranging the order of the integrals, we have:

$$m(r,\Delta\omega_i)=\int m_{true}(r')dr'\int W(t)\exp\{-i2\pi k(t)\cdot(r'-r)-[\Delta\omega(r')-\Delta\omega_i]t\}dt$$

Given that $$\int W(t)\exp\{-i2\pi k(t)\cdot(r'-r)-[\Delta\omega(r')-\Delta\omega_i]t\}dt$$

$$=\int_t W(t)\exp\{i2\pi k(t)r\}dt \int_r \delta(r'-r)\exp\{-i2\pi k(t)\cdot r-[\Delta\omega(r)-\Delta\omega_i]t\}dr$$

$$=psf(r\mid r';\Delta\omega_i)$$

where $psf(r|r';\Delta\omega_i)$ is the PSF evaluated at location r given the input impulse is at r' and the demodulation frequency is $\Delta\omega_i$, we have $$m(r,\Delta\omega_i)=\int m_{true}(r')psf(r|r';\Delta\omega_i)dr' \quad [A.2]$$

We claim:

1. A method for imaging an object, the method comprising:
   (a) providing a scanner for scanning the object using spiral scanning;
   (b) using the scanner to collect a plurality of spiral scans of the object;
   (c) acquiring a low-resolution field map from the plurality of spiral scans;
   (d) acquiring image data from the object by scanning the object with the scanner;
   (e) performing automatic off-resonance correction on the image data in accordance with the low-resolution field map; and
   (f) imaging the object in accordance with the automatic off-resonance correction.

2. The method of claim 1, wherein the plurality of spiral scans comprise two single shot spirals.

3. The method of claim 2, wherein the two single shot spirals have different echo times.

4. The method of claim 3, wherein the different echo times occur during an approach to steady state.

5. The method of claim 1, wherein the automatic off-resonance correction is performed using searching frequencies constrained by the low-resolution field map.

6. The method of claim 5, wherein the automatic off-resonance correction comprises searching only for nonlinear components of off-resonance frequencies.

7. The method of claim 6, wherein the automatic off-resonance correction further comprises forming a polynomial approximation to the low-resolution field map and performing the automatic off-resonance correction in accordance with the polynomial approximation.

8. A system for imaging an object, the system comprising:
   a scanner for scanning the object using spiral scanning;
   a processor, in communication with the scanner, for using the scanner to collect a plurality of spiral scans of the object, acquiring a low-resolution field map from the plurality of spiral scans, acquiring image data from the object by scanning the object with the scanner, performing automatic off-resonance correction on the image data in accordance with the low-resolution field map, and imaging the object in accordance with the automatic off-resonance correction; and
   an output, in communication with the processor, for outputting an image of the object formed by the processor.

9. The system of claim 8, wherein the plurality of spiral scans comprise two single shot spirals.

10. The system of claim 9, wherein the two single shot spirals have different echo times.

11. The system of claim 10, wherein the different echo times occur during an approach to steady state.

12. The system of claim 8, wherein the automatic off-resonance correction is performed using searching frequencies constrained by the low-resolution field map.

13. The system of claim 12, wherein the automatic off-resonance correction comprises searching only for nonlinear components of off-resonance frequencies.

14. The system of claim 13, wherein the automatic off-resonance correction further comprises forming a polynomial approximation to the low-resolution field map and performing the automatic off-resonance correction in accordance with the polynomial approximation.

\* \* \* \* \*

UNITED STATES PATENT AND TRADEMARK OFFICE
CERTIFICATE OF CORRECTION

| | | |
|---|---|---|
| PATENT NO. | : 8,238,634 B1 | Page 1 of 1 |
| APPLICATION NO. | : 12/036693 | |
| DATED | : August 7, 2012 | |
| INVENTOR(S) | : Meyer et al. | |

It is certified that error appears in the above-identified patent and that said Letters Patent is hereby corrected as shown below:

In the specification

In column 1, line 15-17, delete "The work leading to the present invention was supported by NIH Grant No. HL079110." and insert --This invention was made with government support under HL079110 awarded by the National Institutes of Health.--, therefor Signed and Sealed this
Twenty-sixth Day of April, 2016

Michelle K. Lee
*Director of the United States Patent and Trademark Office*